(12) United States Patent
Waser

(10) Patent No.: US 8,564,323 B2
(45) Date of Patent: Oct. 22, 2013

(54) CIRCUIT ARRANGEMENT AND METHOD FOR TESTING A RESET CIRCUIT

(75) Inventor: Karl Georg Waser, Graz (AT)

(73) Assignee: AMS AG, Unterpremstaetten (AT)

( * ) Notice: Subject to any disclaimer, the term of this patent is extended or adjusted under 35 U.S.C. 154(b) by 468 days.

(21) Appl. No.: 12/812,581

(22) PCT Filed: Jan. 9, 2009

(86) PCT No.: PCT/EP2009/000086
§ 371 (c)(1),
(2), (4) Date: Oct. 4, 2010

(87) PCT Pub. No.: WO2009/100802
PCT Pub. Date: Aug. 20, 2009

(65) Prior Publication Data
US 2011/0025365 A1    Feb. 3, 2011

(30) Foreign Application Priority Data
Jan. 10, 2008    (DE) .................. 10 2008 003 819

(51) Int. Cl.
*G01R 31/02*    (2006.01)
(52) U.S. Cl.
USPC ...... 324/762.01; 324/500; 324/537; 327/142; 327/143
(58) Field of Classification Search
USPC .............. 327/142, 143; 324/762.01
See application file for complete search history.

(56) References Cited

U.S. PATENT DOCUMENTS

| 4,849,681 | A * | 7/1989 | Schmidt et al. ............. 320/133 |
| 6,728,891 | B2 * | 4/2004 | Hanjani .................. 713/300 |
| 6,794,946 | B2 * | 9/2004 | Farjad-Rad ................. 331/16 |
| 2001/0019281 | A1 * | 9/2001 | Polizzi et al. ............. 327/143 |
| 2002/0046388 | A1 | 4/2002 | Shirata |
| 2006/0041811 | A1 | 2/2006 | Hsieh |
| 2006/0109037 | A1 * | 5/2006 | Hsu ....................... 327/143 |
| 2007/0216397 | A1 * | 9/2007 | Chan et al. ................ 324/142 |
| 2007/0266280 | A1 | 11/2007 | Ng et al. |

FOREIGN PATENT DOCUMENTS

KR    10-2007-0076080    7/2007

OTHER PUBLICATIONS

L.X. Yu et al., "A Low Quiescent Current and Reset Time Adjustable Power-on Reset Circuit", ASIC, vol. 2, No. 24, pp. 568-571, Oct. 24, 2005.

* cited by examiner

*Primary Examiner* — Patrick Assouad
*Assistant Examiner* — Alexander J Nemtzow
(74) *Attorney, Agent, or Firm* — McDermott Will & Emery LLP

(57) ABSTRACT

A circuit arrangement (10) for testing a reset circuit (11) comprises the reset circuit (11) and a changeover switch (14). The reset circuit comprises a voltage input (12) for feeding an input voltage (VDD) and an output (13) for providing a reset signal (POR) as a function of the input voltage (VDD). The changeover switch (14) comprises a first input (15) for feeding a test voltage (VTM), a second input (16) for feeding a supply voltage (VBAT), a control input (17) for changing over between the first and the second input (15, 16) as a function of the test signal (TM), and an output (18) that is coupled to the voltage input (12) of the reset circuit (11).

11 Claims, 6 Drawing Sheets

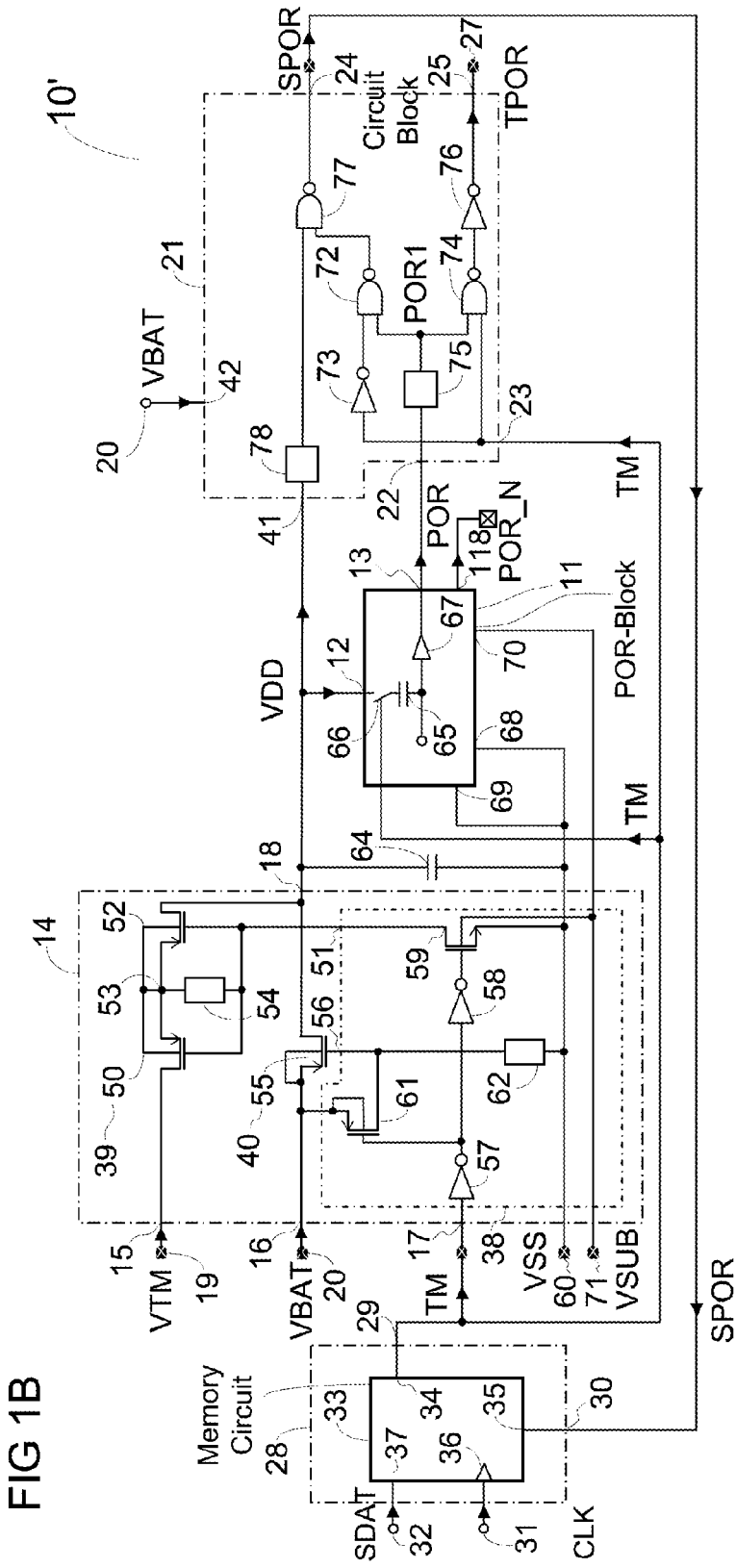

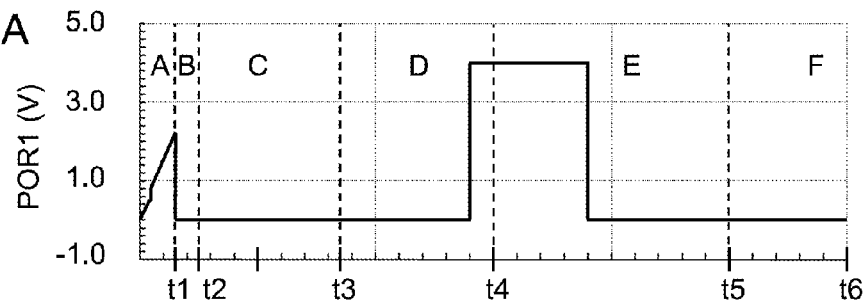
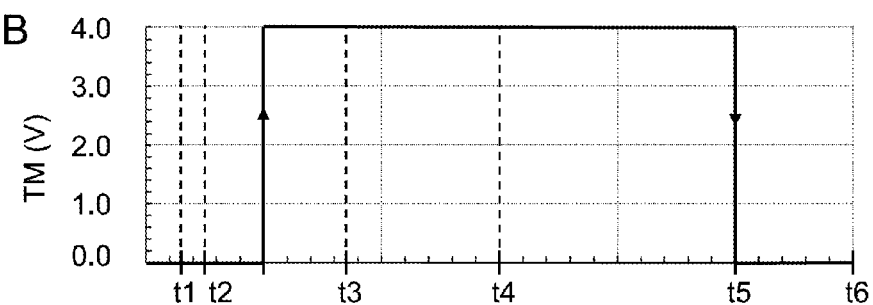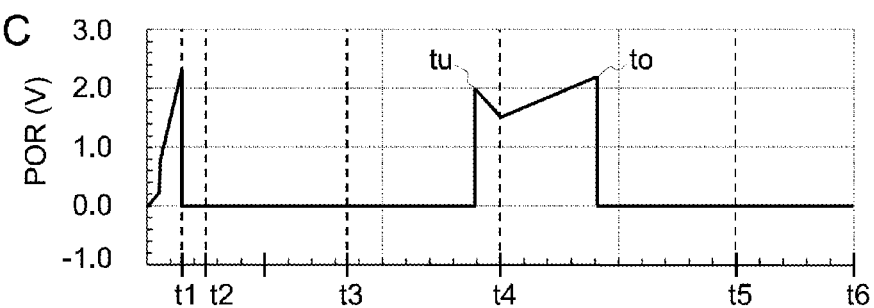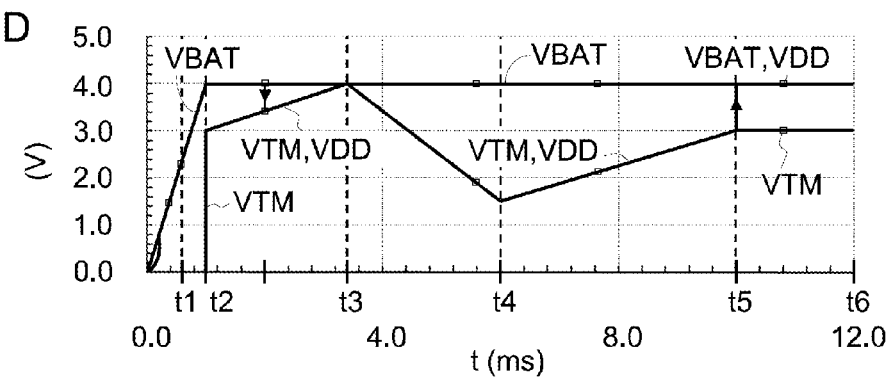

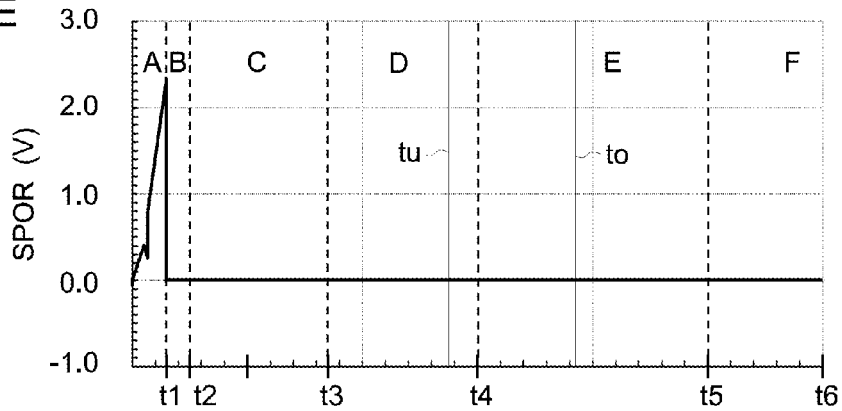
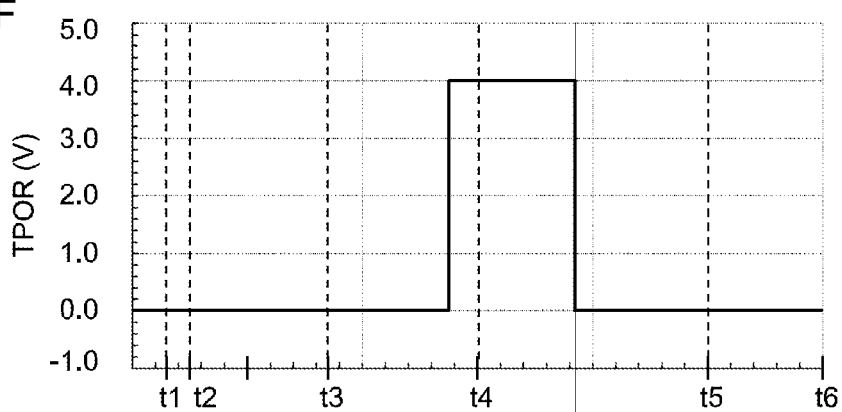
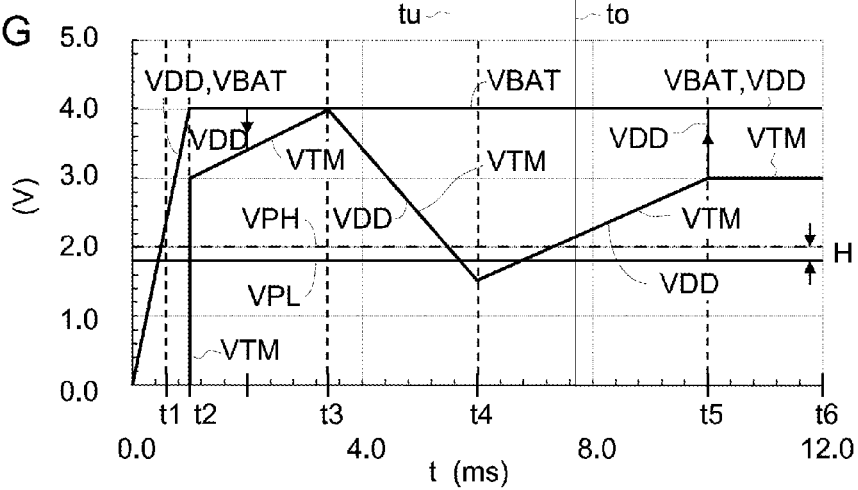

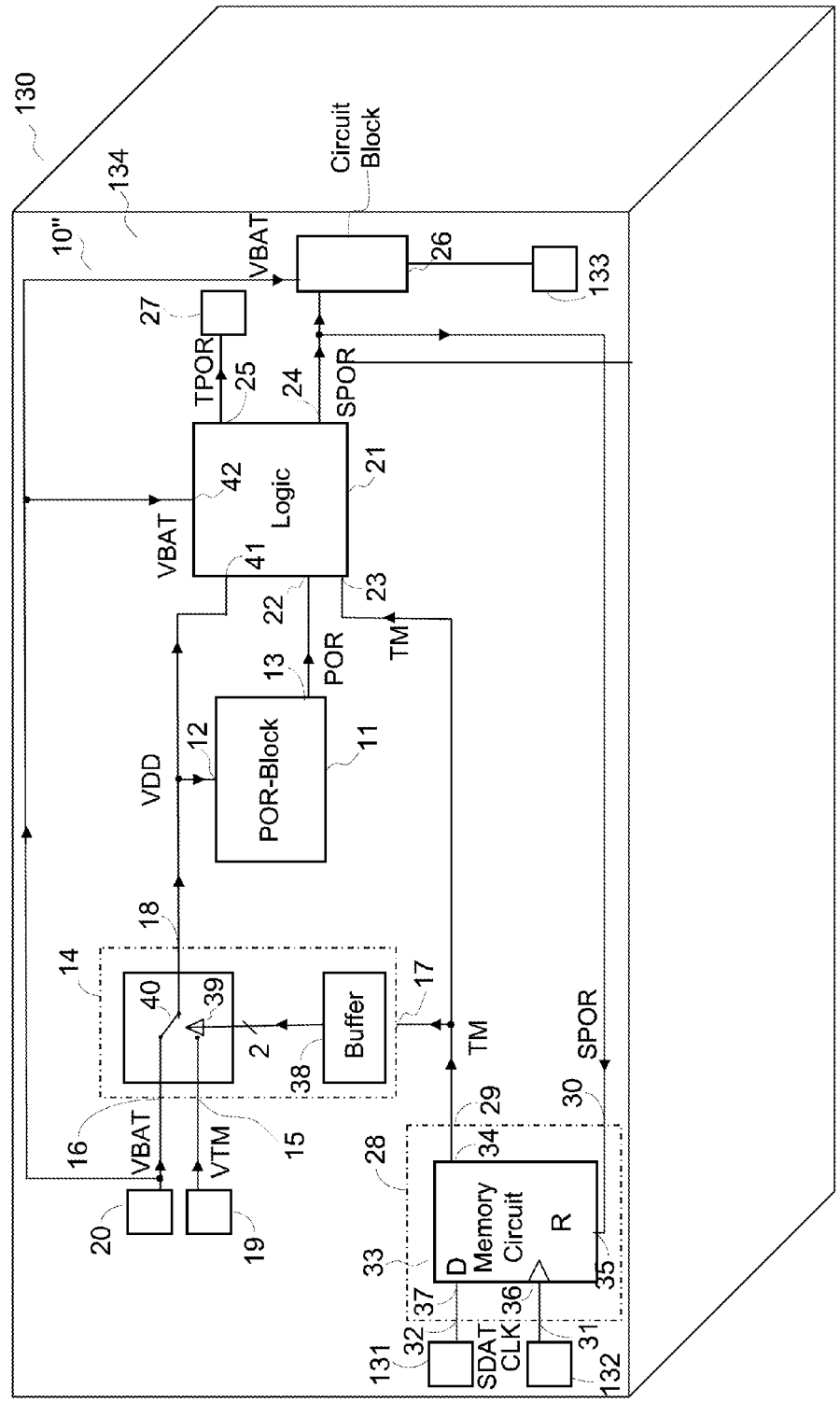

CIRCUIT ARRANGEMENT AND METHOD FOR TESTING A RESET CIRCUIT

RELATED APPLICATIONS

This is a U.S. national stage of application No. PCT/EP2009/000086, filed on Jan. 9, 2009.

This patent application claims the priority of German patent applications 10 2008 003 819.9 filed Jan. 10, 2008, the disclosure content of which is hereby incorporated by reference.

FIELD OF THE INVENTION

The present invention relates to a circuit arrangement and a method for testing a reset circuit.

BACKGROUND OF THE INVENTION

Circuit arrangements frequently have a reset circuit, to which a supply voltage of the circuit arrangement is fed and which provides a reset signal as a function of the supply voltage. The reset signal is routed to a circuit block of the circuit arrangement. The reset signal has a value that activates the additional block of the circuit arrangement insofar as the supply voltage exceeds a level at which the circuit block can be reliably operated. This principle is also referred to as power-on reset.

The document US 2006/0041811 A1 describes a circuit for testing a reset function of an electronic component. The circuit possesses a first and a second adjustable resistor and a device for switching between different voltages by means of a bridge. A voltage at the output of the circuit is routed to the component to be tested.

An arrangement for testing a reset circuit of an integrated circuit is specified in the document US 2007/0266280 A1. The arrangement comprises one reset circuit for an operation of the integrated circuit and a duplicated reset circuit for test purposes.

SUMMARY OF THE INVENTION

An object of the present invention is to provide a circuit arrangement for testing a reset circuit and a method for testing a reset circuit that allow a test of the reset circuit with a test voltage.

In one embodiment, a circuit arrangement for testing a reset circuit comprises the reset circuit and a changeover switch. The reset circuit has a voltage input and an output. The changeover switch has a first and second input, a control input and an output. The output of the changeover switch is connected to the voltage input of the reset circuit.

An input voltage is supplied to the voltage input of the reset circuit. A reset signal is provided at the output of the reset circuit as a function of the input voltage. A test voltage is supplied to the first input of the changeover switch. A supply voltage is applied to the second input of the changeover switch. A test adjustment signal is supplied to the control input of the changeover switch. The changeover switch is switched between the first and the second input as a function of the test adjustment signal.

It is advantageously determined by means of the changeover switch whether the supply voltage or the test voltage will be sent to the voltage input of the reset circuit. Thus, it is selectively possible to route the test voltage or the supply voltage to the reset circuit. The functionality of the reset circuit can be advantageously checked in a test operation by means of a test voltage that is independent of the supply voltage of the circuit arrangement. The reset circuit can thus generate a digital reset signal as a function of an analog test voltage.

In one embodiment, the circuit arrangement comprises an input logic circuit. The input logic circuit is connected at one output to the control input of the changeover switch and provides the test adjustment signal. The input logic circuit can have a memory circuit. The memory circuit can comprise a flip-flop or an asynchronous logic or combinatoric logic.

If the test adjustment signal has a logic value 1, then the test operation is activated. In the test operation of the circuit arrangement, the first input of the changeover switch is connected to the output of the changeover switch. If, on the other hand, the test adjustment signal has a logic value 0, then the test operation of the circuit arrangement is deactivated and the circuit arrangement is in normal operation. In that case, the second input of the changeover switch is connected to the output of the changeover switch.

In a refinement, the circuit arrangement comprises an output logic circuit. A first input of the output logic circuit is connected to the output of the reset circuit. A second input of the output logic circuit is connected to the output of the input logic circuit. A first output of the output logic circuit is connected to a circuit block of the circuit arrangement. A second output of the output logic circuit is coupled to an output contact area of the circuit arrangement. Thus the reset signal is supplied to the first input of the output logic circuit. The second input of the output logic circuit serves to route the test adjustment signal to the output logic circuit. A system reset signal is emitted at the first output of the output logic circuit. The system reset signal is provided as a function of the reset signal and the test adjustment signal. The system reset signal here is generated from the reset signal insofar as the test operation of the circuit arrangement is deactivated. If, however, the test operation of the circuit arrangement is activated by means of the test adjustment signal, then the system reset signal has a logic value that deactivates the circuit block. A result signal is provided at the second output of the output logic circuit. The result signal is generated as a function of the reset signal and the test adjustment signal. If the test adjustment signal has a value activating the test operation, then the result signal corresponds to the reset signal. If the test operation is deactivated by means of the test adjustment signal, then the result signal has a constant value. The reset circuit can be advantageously isolated from the circuit block in test operation by means of the output logic circuit. The isolation can be performed without generating a system reset signal that resets the circuit arrangement.

In one embodiment, a semiconductor body comprises the circuit arrangement. Preferably exactly one semiconductor body comprises the circuit arrangement.

The semiconductor body can preferably comprise the reset circuit, the input logic circuit and the output logic circuit. The semiconductor body can additionally have the changeover switch.

Advantageously, in an operating state in which there is no test operation, the power consumption of the circuit arrangement is not increased by the changeover switch, the input logic circuit and the output logic circuit.

In one embodiment, a method for testing a reset circuit comprises feeding a supply voltage as an input voltage to the reset circuit in normal operation. In addition, there is a changeover from normal operation to a test operation as a function of a test adjustment signal. A test voltage is routed as the input voltage to the reset circuit in test operation, and a reset signal is generated by means of the reset circuit as a function of the input voltage.

Thus a test voltage can advantageously be supplied to a reset circuit, and the reset signal can be generated by means of the test voltage. Thereby a test operation of the reset circuit is enabled. The reset signal can be isolated from a circuit block of the circuit arrangement, so that an isolated test operation of the reset circuit is enabled. In the test operation, the reset signal is not routed to the circuit block.

In a refinement, the method comprises the following steps in the test operation: the supply voltage is applied to a circuit arrangement that comprises the reset circuit and a circuit block. Thereby the circuit arrangement is switched on. The reset circuit is electrically separated from the circuit arrangement by means of the test adjustment signal. The reset circuit is thus electrically isolated. In normal operation, the reset signal is routed to the circuit block. To perform the isolation of the reset circuit, the reset signal is not supplied to the circuit block in test operation. In test operation, a signal that deactivates the circuit block can be routed to the circuit block. The adjustable test voltage is supplied via a separate path to the previously isolated reset circuit, which generates the reset signal. The test voltage is an analog voltage. The test voltage can have continuous voltage values. The reset signal is provided as a result signal. The result signal is a digital signal. The result signal therefore has discrete values. A dependency of the result signal on the test signal is evaluated. At least one threshold value of the reset circuit is determined. The reset signal is generated in test operation and in normal operation as a function of the threshold value. The reset circuit can advantageously be tested while cut off from the circuit block.

In a refinement, the test voltage passes in test operation through a voltage ramp with increasing voltage values for the detection of a first threshold value of the reset circuit. The first threshold value in this case corresponds to the value of the test voltage at which the result signal changes its logic value. Alternatively, the test voltage passes through a voltage ramp with decreasing voltage values for the detection of a second threshold value of the reset circuit. The second threshold value in this case corresponds to the value of the test voltage at which the result signal changes its logic value in case of decreasing voltage values of the test voltage. The test voltage preferably passes through a voltage ramp with decreasing voltage values and a voltage ramp with increasing voltage values. The second threshold value is advantageously lower than the first threshold value. An advantage of such a hysteresis is that in case of an input voltage with a value that corresponds roughly to the first threshold value, small fluctuations of the input voltage do not immediately lead to changes in the reset signal.

In a test of the reset circuit according to one embodiment, the remaining parts of the circuit arrangement, in particular a circuit block of the circuit arrangement, are not influenced by the test.

In one embodiment, the circuit arrangement is arranged on a main surface of a semiconductor body.

In a preferred embodiment, the circuit arrangement is arranged on a main surface of exactly one semiconductor body.

BRIEF DESCRIPTION OF THE DRAWINGS

The invention will be described in detail below for several exemplary embodiments with reference to the figures. Components and circuit elements that are functionally identical or have the identical effect bear identical reference numbers. Insofar as circuit parts or components correspond to one another in function, a description of them will not be repeated in each of the following figures.

Therein:

FIGS. 1A and 1B show exemplary embodiments of a circuit arrangement with a reset circuit according to the invention, FIG. 1C shows an exemplary embodiment of a time characteristic of signals of the circuit arrangement according to an example of the invention, FIGS. 3A to 3G show exemplary signal curves of a signal arrangement with a reset circuit according to the invention, and FIG. 4 shows an exemplary embodiment of a semiconductor body with the circuit arrangement according to the invention.

DETAILED DESCRIPTION OF THE DRAWINGS

Figure 1A:
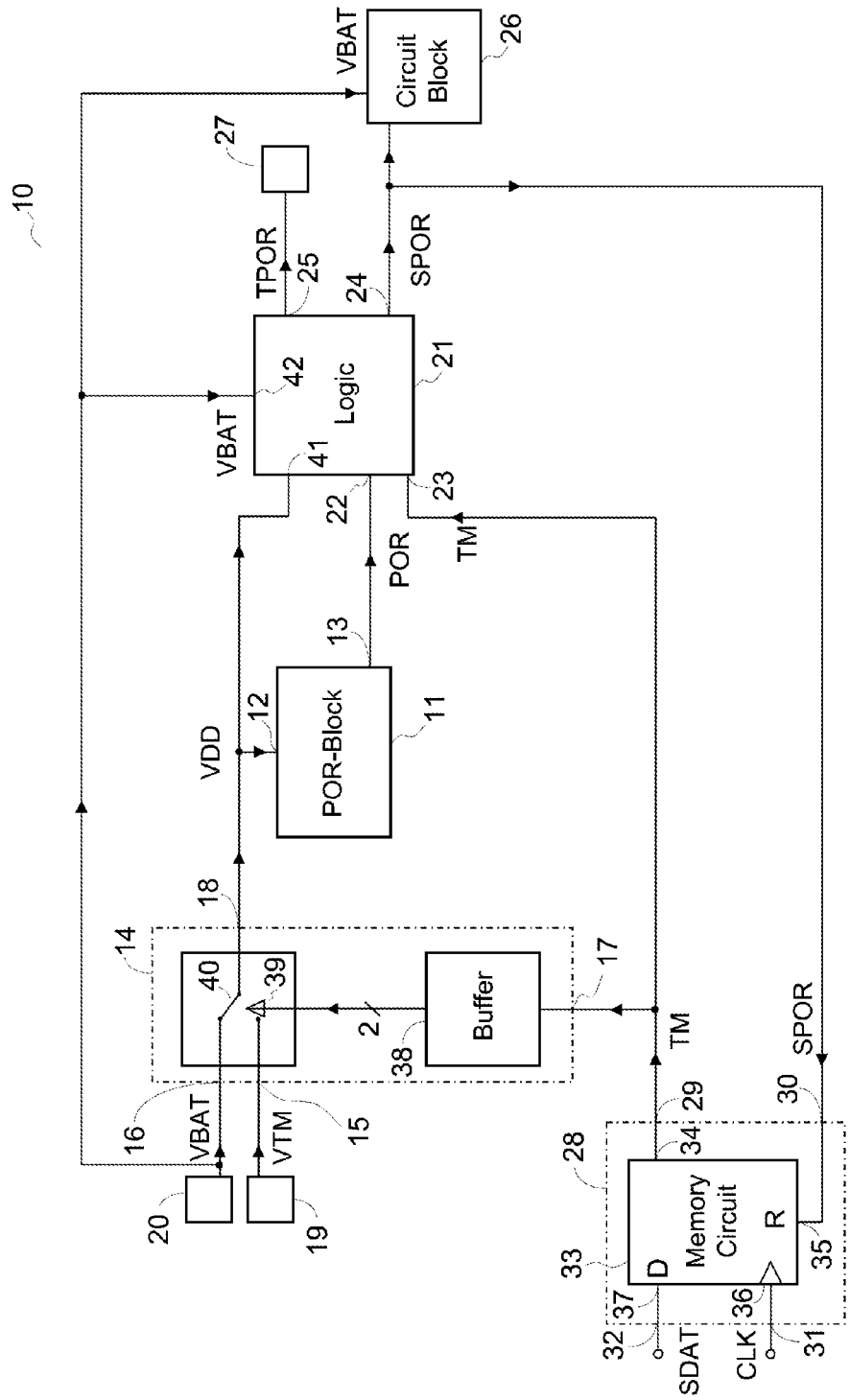

FIG. 1A shows an exemplary embodiment of a circuit arrangement with a reset circuit according to the proposed principle. The reset circuit 11 comprises a voltage input 12 and an output 13. The reset circuit 11 can also be referred to as a power-on reset block, abbreviated POR block. The circuit arrangement further comprises a changeover switch 14 with a first and a second input 15, 16, a control input 17 and an output 18. The output 18 of the changeover switch 14 is connected to the voltage input 12 of the reset circuit 11. A first contact area 19 of the circuit arrangement 10 is connected to the first input 15 of the changeover switch 14. Accordingly, a second contact area 20 of the circuit arrangement 10 is connected to the second input 16 of the changeover switch 14. The circuit arrangement 10 further comprises an output logic circuit 21 with a first and a second input 22, 23, as well as a first and a second output 24, 25. The first input 22 of the output logic circuit 21 is connected to the output 13 of the reset circuit 11. In addition, the circuit arrangement 10 comprises a circuit block 26 that is connected to the first output 24 of the output logic circuit 21. The circuit block 26 is additionally connected to the second contact area 20. The circuit arrangement 10 further comprises an output contact area 27 that is coupled to the second output 25 of the output logic circuit 21.

The circuit arrangement 10 further comprises an input logic circuit 28 with an output 29. The output 29 is connected to the control input 17 of the changeover switch 14. The output 29 of the input logic circuit 28 is additionally connected to the second input 23 of the output logic circuit 21. The input logic circuit 28 further comprises a first input 30 that is coupled to the first output 24 of the output logic circuit 21. The input logic circuit 28 further comprises a second input 32 and a third input 31. The input logic circuit 28 is implemented as a test operation register. The input logic circuit 28 comprises a memory circuit 33. The memory circuit 33 is realized as a flip-flop. A data output 34 of the memory circuit 33 is connected to the output 29 of the input logic circuit 28. A reset input 35 of the memory circuit 33 is connected to the first input 30 of the input logic circuit 28. A clock input 36 of the memory circuit 33 is coupled to the third input 31 of the input logic circuit 28. A data input 37 of the memory circuit 33 is connected to the second input 32 of the input logic circuit 28.

The changeover switch 14 further comprises a buffer 38 as well as a first and a second switch 39, 40. The buffer 38 is connected between the control input 17 of the changeover switch 14 and the control inputs of the first and the second switch 39, 40. The first switch 39 connects the first input 15 of the changeover switch 14 to the output 18 of the changeover switch 14. Correspondingly, the second switch 40 connects the second input 16 of the changeover switch 14 to the output 18 of the changeover switch 14. The output logic circuit 21 further comprises a third input 41 that is connected to the output 18 of the changeover switch 14. The output logic circuit 21 additionally comprises a fourth input 42 that is connected to the second input 16 of the changeover switch 14 and thus to the second contact area 20.

A test voltage VTM is fed to the first input 15 of the changeover switch 14 via the first contact area 19. A supply voltage VBAT is fed to the second input 16 of the changeover switch 14 via the second contact area 20. The supply voltage VBAT serves to supply the circuit arrangement 10. The circuit block 26 is supplied by the supply voltage VBAT. A test adjustment signal TM is routed to the control input 17 of the changeover switch 14. The first or the second switch 39, 40 is optionally closed as a function of the test adjustment signal TM, so that alternatively the first or the second input 15, 16 of the changeover switch 14 is connected to the output 18 of the changeover switch 14. The voltage present at the output 18 of the changeover switch 14 is routed as an input voltage VDD to the voltage input 12 of the reset circuit 11. The input voltage VDD therefore corresponds to the supply voltage VBAT or alternatively the test voltage VTM.

The reset circuit 11 generates a reset signal POR as a function of the input voltage VDD. The reset signal POR is thereby generated with an activating value insofar as the input voltage VDD exceeds a first threshold value VPH. The first threshold value VPH is set such that a supply voltage VBAT with a value greater than the first threshold value VPH is sufficient for secure operation of the circuit block 26.

The reset signal POR is supplied via the output 13 of the reset circuit 11 to the first input 22 of the output logic circuit 21. The test adjustment signal TM is applied to the second input 23 of the output logic circuit 21. The input voltage VDD is routed to the third input 41 of the output logic circuit 21. The supply voltage VBAT, which is used to supply the gates of the output logic circuit 21, is present at the fourth input 42. The output logic circuit 21 generates a system reset signal SPOR as a function of the reset signal POR and the test adjustment signal TM, and provides the system reset signal SPOR at the first output 24. The system reset signal SPOR is routed to the circuit block 26 and serves to activate the circuit block 26, insofar as the supply voltage VBAT has exceeded the first threshold value VPH. As a function of the test adjustment signal TM and the reset signal POR, the output logic circuit 21 additionally provides a result signal TPOR at the second output 25 of the output logic circuit 21. The result signal TPOR is realized as a digital signal. The result signal TPOR is supplied to the output contact area 27. An interface, not shown, of the circuit arrangement 10 comprises the output contact area 27.

The system reset signal SPOR is additionally routed via the first input 30 of the input circuit arrangement 28 to the reset input 35 of the memory circuit 33. At its data output 34, the memory circuit 33 generates the test adjustment signal TM, which is routed via the output 29 of the input logic circuit 28 to the changeover switch 18 and the output logic circuit 21. A clock signal CLK is supplied via the third input 31 of the input logic circuit 28 to the clock input 36 of the memory circuit 33. A data signal SDAT is routed via the second input 32 of the input logic circuit 28 to the data input 37 of the memory circuit 33. The memory circuit 33 generates the test adjustment signal TM as a function of the clock signal CLK, the system reset signal SPOR and the data signal SDAT. The test adjustment signal TM and the data signal SDAT are configured as electrical signals. The changeover switch 14 is realized as an electronic changeover switch. The first and the second switches 39, 40 are realized as electronic switches.

The reset signal POR is supplied via the output 13 of the reset circuit 11 to the first input 22 of the output logic circuit 21. The test adjustment signal TM is applied to the second input 23 of the output logic circuit 21. The input voltage VDD is routed to the third input 41 of the output logic circuit 21. The supply voltage VBAT, which is used to supply the gates of the output logic circuit 21, is present at the fourth input 42. The output logic circuit 21 generates a system reset signal SPOR as a function of the reset signal POR and the test adjustment signal TM, and provides the system reset signal SPOR at the first output 24. The system reset signal SPOR is routed to the circuit block 26 and serves to activate the circuit block 26, insofar as the supply voltage VBAT has exceeded the first threshold value VPH. As a function of the test adjustment signal TM and the reset signal POR, the output logic circuit 21 additionally provides a result signal TPOR at the second output 25 of the output logic circuit 21. The result signal TPOR is realized as a digital signal. The result signal TPOR is supplied to the output contact area 27. An interface, not shown, of the circuit arrangement 10 comprises the output contact area 27.

By means of the buffer 38, it is advantageously possible to make an adjustment such that if a defined test adjustment signal TM is absent, the second switch 40 is closed and thus the supply voltage VBAT is routed to the reset circuit 11.

The reset circuit 11 is advantageously supplied for the test operation via a separate supply path, which comprises the first switch 39 of the changeover switch 14 and the first contact area 19. A measurement of a threshold value of the reset circuit 11 is advantageously performed in such a manner that a result is emitted via an output path that comprises the output logic circuit 21 and the output terminal 27. The test advantageously tests the same reset circuit 11 that guarantees the reset function for the circuit arrangement 10, in particular the circuit block 26, in the subsequent operation.

In an alternative embodiment, not shown, the circuit arrangement 10 comprises a multiplexer that is connected on the input side to the second output 25 of the output logic circuit 21, and on the output side to a contact area. The contact area is thus implemented as a test-mode pin. Thus the number of contact areas can advantageously be kept low and a surface area of a semiconductor body 130 that comprises the circuit arrangement can be kept small.

FIG. 1B shows an exemplary embodiment of a circuit arrangement with a reset circuit according to the invention. The circuit arrangement 10' according to FIG. 1B is a refinement of the embodiment shown in FIG. 1A and those aspects will not be described again. The first switch 39 comprises a first switching transistor 50 that is connected between the first input 14 and the output 18 of the changeover switch 14. A control terminal of the first transistor 50 is connected to a first output 51 of the buffer 38. The first switch 39 further comprises a second switching transistor 52 that is connected in series to the first switching transistor 50. The second switching transistor 52 is arranged between the first switching transistor 50 and the output 18 of the changeover switch 14. A control terminal of the second switching transistor 52 is likewise connected to the first output 51 of the buffer 38. A node 53 between the first and the second switching transistors 50, 52 is connected via a first resistor 54 to the two control terminals of the first and of the second switching transistor 50, 52. The node 53 is likewise connected to the two substrate terminals of the first and of the second switching transistor 50, 52. The second switch 40 comprises a third switching transistor 55 that is connected between the second input 16 and the output 18 of the changeover switch 14. A control terminal of the third transistor 55 is connected to a second output 56 of the buffer 38.

The buffer 38 comprises a first and a second inverter 57, 58 that are connected in series. One input of the first inverter 57 is connected to the control input 17 of the changeover switch 14. The buffer 38 comprises a fourth switching transistor 59 that connects the first output 51 of the buffer 38, and thus the control inputs of the first and of the second switching transistor 50, 52, to a reference potential terminal 60. One output of the first inverter 57 is connected via the second inverter 58 to a control terminal of the fourth switching transistor 59. The buffer 38 has a fifth switching transistor 61 that connects the second input 16 of the changeover switch 14 to the second output 56 of the buffer 38. The second output 56 of the buffer 38 is connected via a second resistor 62 to the reference potential terminal 60. The output of the first inverter 57 is connected to a control terminal of the fifth switching transistor 61. The first, second, third and fifth switching transistors 50, 52, 55, 61 are each realized as a p-channel field effect transistor. The fourth switching transistor 59 is implemented as an n-channel field effect transistor. The first, second and third switching transistors 50, 52, 55 each have a high width-to-length ratio, so that their on-state resistance is low.

In addition, the circuit arrangement 10' comprises a buffer capacitor 64 that connects the output 18 of the changeover switch 14 to the reference potential terminal 60. The reset circuit 11 comprises a capacitor 65 and a switch 66. A first electrode of the capacitor 65 is connected via the switch 66 to the voltage input 12 of the reset circuit 11. An output driver 67 of the reset circuit 11 is connected between a second electrode of the capacitor 65 and the output 13 of the reset circuit 11. A control terminal of the switch 66 is connected via the output 29 of the input logic circuit 28 to the data output 33 of the memory circuit 32. The reset circuit 11 further comprises a first, a second and a third terminal 68, 69, 70. The first and the second terminals 68, 69 are connected to the reference potential terminal 60. The third terminal 70 is connected to a substrate bias potential terminal 71.

The output logic circuit 21 comprises a first logic gate 72, a first inverter 73 and a second logic gate 74. A first input of the first logic gate 72 and a first input of the second logic gate 74 are connected to one another and are coupled to the output 13 of the reset circuit 11 via the first input 22 of the output logic circuit 21. A second input of the second logic gate 74 is connected to the second input 23 of the output logic circuit 21. A second input of the first logic gate 72 is likewise connected via the first inverter 73 to the second input 23 of the output logic circuit 21. The output logic circuit 21 additionally has a first level shifter 75 that connects the first input 22 of the output logic circuit 21 to the two first inputs of the first and of the second logic gate 72, 74. The first and the second logic gates 72, 74 are realized as NAND gates. One output of the first logic gate 72 is connected to the first output 24 of the output logic circuit 21. The output logic circuit 21 has a third logic gate 77 that is connected at a first input to the output of the first logic gate 72 and at one output to the first output 24 of the output logic circuit 21. The third logic gate 77 comprises an inverting function. The output logic circuit 21 further comprises a second level shifter 78 that connects the third input 41 of the output logic circuit 21 to a second input of the third logic gate 77. The third logic gate 77 is likewise realized as a NAND gate. One output of the second logic gate 74 is connected to the second output 25 of the output logic circuit 21. The output logic circuit 21 comprises a second inverter 76, which is connected between the output of the second logic gate 74 and the second output 25 of the output logic circuit 21.

The fourth switching transistor 59 provides a control signal for the first and the second switching transistors 50, 52. The fourth switching transistor 59 is provided, via the first and the second inverters 57, 58, with the test adjustment signal TM without inversion. If the test adjustment signal TM has the logic value 1, and thus a high voltage value, then the fourth switching transistor 59 is conductive. Thus the control terminals of the first and of the second switching transistor 50, 52 are connected to the reference potential terminal 60. The control signals of the first and of the second switching transistor 50, 52 consequently correspond to a reference potential VSS that can be tapped at the reference potential terminal 60. The first and the second switching transistors 50, 52 are thus switched on, so that the test voltage VTM present at the first input 15 of the changeover switch 14 is provided at the output 18 of the changeover switch 14.

Via the connection of the node 53 to the two substrate terminals of the first and of the second switching transistor 50, 52, a substrate voltage is supplied to the two switching transistors 50, 52. If the test adjustment signal TM has the logic value 0, and thus a low voltage value, then the fourth switching transistor 59 blocks. In this case, the control terminals of the first and of the second switching transistor 50, 52 are charged sufficiently that the two switching transistors 50, 52 block. A current can flow to the node 53 through the first switching transistor 50 if the test voltage VTM is higher than the voltage at the node 53, so that a diode between a first terminal of the first switching transistor 50 and the substrate terminal of the first switching transistor 50 becomes conductive. Likewise, the control terminals of the first and of the second switching transistor 50, 52 can be charged via the second switching transistor 52 as long as a voltage at the output 18 of the changeover switch 14 is higher than the voltage at the node 53. The current can flow, for example, through a diode between a terminal of the second switching transistor 52 and the substrate terminal of the second switching transistor 52. The two switching transistors 50, 52 can likewise be charged by sub-threshold currents. The first and second switching transistors 50, 52 thus require no external substrate voltage provided by a substrate voltage source.

If the test adjustment voltage TM has the logic value 1, then the logic value 0 can be tapped at the output of the first inverter 57, so that the fifth switching transistor 61 is conductive. Thus the control terminal of the third switching transistor 55 is connected to the second input 16 of the changeover switch 14. If the supply voltage VBAT is present with a high value at the second input 16, then the third switching transistor 55 is blocked thereby. If the test adjustment voltage TM has the logic value 0, then the logic value 1 can be tapped at the output of the first inverter 57, which switches the fifth switching transistor 61 to the blocking state. Thus the control terminal of the third switching transistor 55 is set to reference potential VSS via the resistor 62, so that the third switching transistor 55 is switched to the conductive state In this case, the supply voltage VBAT provided at the second input 16 of the changeover switch 14 by means of the third switching transistor 55 is emitted at the output 18 of the changeover switch 14.

The buffer capacitor 64 serves to buffer the input voltage VDD that is present at the voltage input 12 of the reset circuit 11. Thereby interference voltages that may be generated during switching processes in the changeover switch 14 are reduced and a triggering of the reset signal POR merely because of the interference voltages during changeover processes is avoided. The capacitor 65 of the reset circuit 11 serves to adjust a time constant with which the reset signal POR is provided. In order to be able to test the functioning of the reset circuit 11 more quickly in the test operation, the test adjustment signal TM is routed to the control input of the switch 66 and the capacitor 65 is deactivated by means of the switch 66.

As shown in FIG. 1C, at low values of the input voltage VDD, the reset circuit 11 provides the reset signal POR at the voltage value of the input voltage VDD. If the input voltage VDD exceeds a first threshold value VPH, then the reset signal POR takes on the voltage value of 0 V and thus a first logic value. If the reset signal POR has the voltage value of the input voltage VDD, then the reset signal POR has a second logic value. The first logic value is 0 and the second logic value is 1. An inverted reset signal POR N is emitted at an additional output 118 of the reset circuit 11.

The result signal TPOR has the logic value 1 only if the test adjustment signal TM and the reset signal POR have the logic value 1. In all other cases, the result signal has the logic value 0. The system reset signal SPOR has the logic value 1 if the test adjustment signal TM has the logic value 0 and the reset signal POR has the logic value 1. The first level shifter 75 increases the reset signal POR, so that a derived reset signal POR1 can be tapped at the output of the first level shifter. The logic value 1 of the derived reset signal POR1 therefore corresponds to a voltage value of the supply voltage VBAT. Without the first level shifter 75, the voltage value of the input voltage VDD and thus the voltage value of the test voltage VTM would be routed as a logic value 1 in test operation to the first and second logic gates 72, 74. The output logic circuit 21 is supplied in test operation, as well as in an operating state without a test operation, by the supply voltage VBAT. The first level shifter 75 has the effect that a logic value 1 of the reset signal POR is recognized with improved accuracy by the first and second logic gates 72, 74, even in case of a small voltage value of the reset signal POR. The two-level shifters 75, 78 are therefore advantageous for the test operation.

The feedback of the system reset signal SPOR to the input logic circuit 28 has the effect that the test adjustment signal TM has the logic value 0 so long as the system reset signal SPOR has the logic value 1. Only if the supply voltage VBAT has exceeded the first threshold value VPH and therefore the system reset signal SPOR has the logic value 0 can a test operation be started by means of the data signal SDAT and the clock signal CLK, and the test adjustment signal TM can be set to the logic value 1.

Faults in the changeover switch 14 can advantageously be detected. If the third switching transistor 55 has a defect in the form of a short circuit, then the result signal TPOR does not show the logic value 1 even at low values of the test voltage VTM. If the third switching transistor 55 has a defect such that it cannot be switched into a conductive operating state, then the system reset signal SPOR does not have the logic value 1 in any operating state. If the fifth switching transistor 61 has a defect in the form of a short circuit, then the third switching transistor 55 cannot be switched on, and the system reset signal SPOR always has the logic value 1. If, on the other hand, the fifth switching transistor 61 has the defect that it cannot be switched into a conductive operating state, but rather is always nonconductive, then the third switching transistor 55 is always turned on, so that the input voltage VDD depends on the supply voltage VBAT and the test voltage VTM. A first voltage source provides the supply voltage VBAT. However, a second voltage source provides the test voltage VTM. The voltage source among the two voltage sources that has the lower internal resistance adjusts the input voltage VDD via the internal resistances of the voltage sources and the switch resistances. If the first voltage source has a lower internal resistance than the second voltage source, then the result signal TPOR is independent of the value of the test voltage VTM and has the logic value 0.

Malfunctions of the changeover switch 14, the input logic circuit 28 and the output logic circuit 21 can advantageously be determined in the test operation.

A delay time with which the reset signal POR is provided can advantageously be adjusted by means of the capacitor 65. By means of the switch 66, the capacitor 65 can be disconnected from a signal path by means of which the reset signal POR is generated. In the test operation, the reset signal POR is therefore generated without delay by the capacitor 65.

In an alternative embodiment, the first logic value is 1 and the second logic value is 0.

In an alternative embodiment, not shown, the output logic circuit 21 can have other logic gates and/or a different logical linkage that realize the same logic function as the output logic circuit 21 shown here. For example, one or more of the NAND gates can be replaced by a NOR gate with input-side and output-side inverters.

In an alternative embodiment, not shown, the first switch 39 can be realized as a transmission gate.

Figure 2:
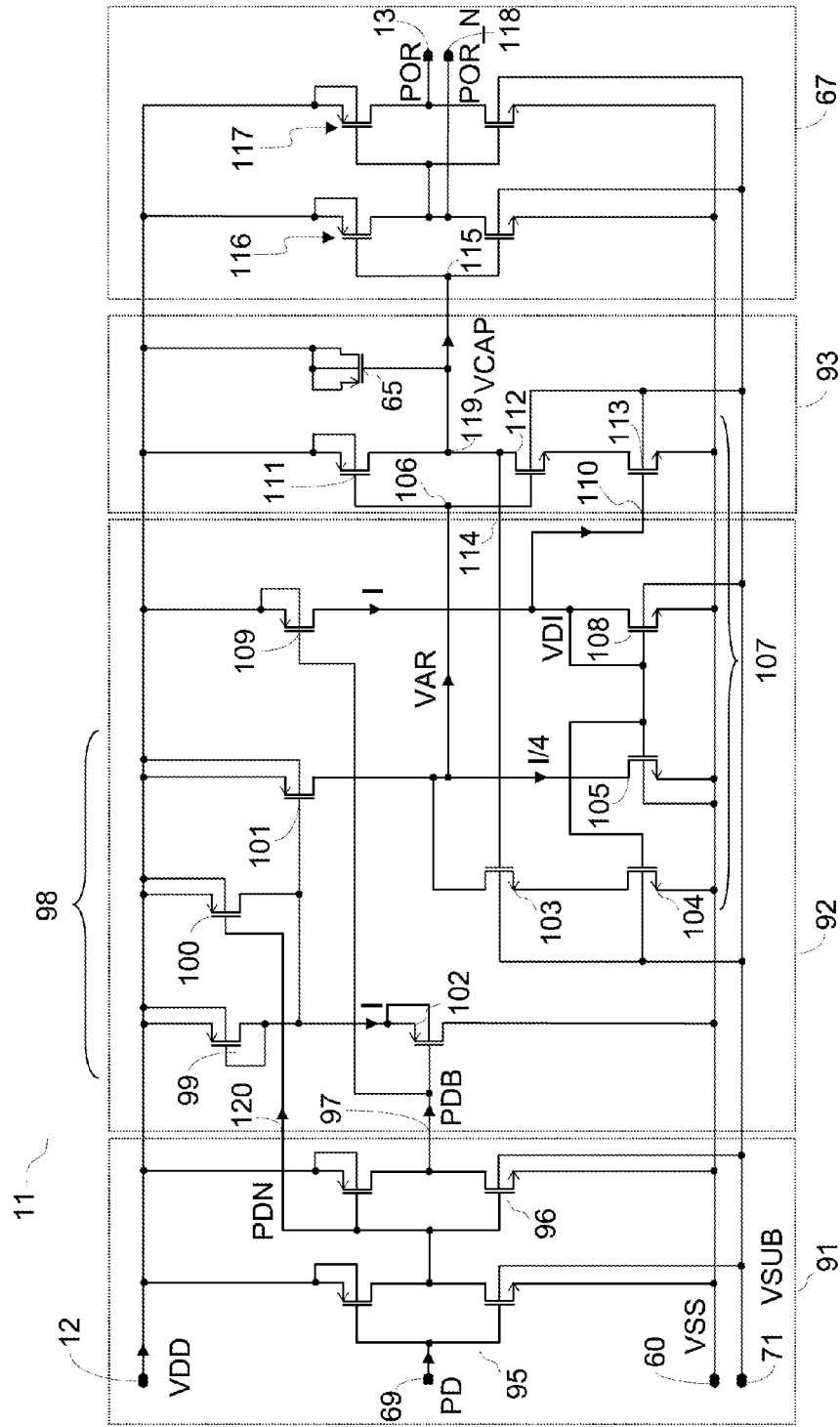
FIG. 2 shows an exemplary embodiment of a reset circuit according to the invention.

FIG. 2 shows an exemplary embodiment of a reset circuit that can be used in the circuit arrangements according to FIGS. 1A and 1B. The reset circuit 11 has a deactivation circuit 91, an evaluation circuit 92, a delay circuit 93 and the output driver 67. The reset circuit 11, and thus the four circuits 91, 92, 93 67, are inserted between the voltage input 12 and the reference potential terminal 60. The deactivation circuit 91 has two series-connected inverters 95, 96, each connecting the voltage input 12 to the reference potential terminal 60. One input of a first inverter 95 is connected to the second terminal 69 of the reset circuit 11. One output of the first inverter 95 is connected to an input of the second inverter 96. One output of the second inverter 96 is connected to an input 97 of the evaluation circuit 92.

The evaluation circuit 92 comprises a first current mirror 98 with a first and a second current mirror transistor 99, 101. The two current mirror transistors 99, 101 are connected at a first terminal to the voltage input 12. A control terminal of the first current mirror transistor 99 is connected to a second terminal of the first current mirror transistor 99 as well as to a control terminal of the second current mirror transistor 101. The evaluation circuit 92 further comprises a power-down transistor 100. A first terminal of the power-down transistor 100 is connected to the voltage input 12. The control terminal of the first current mirror transistor 99 is connected to a second terminal of the power-down transistor 100. A control terminal of the power-down transistor 100 is connected via an additional input 120 of the evaluation circuit 92 to the output of the first inverter 95. The first current mirror transistor 99 is connected via a first transistor 102 to the reference potential terminal 60. The first current mirror transistor 99 and the first transistor 102 together form a voltage divider for the input voltage VDD. A control terminal of the first transistor 102 is connected to the input 97 of the evaluation circuit 92. A second terminal of the second current mirror transistor 101 is connected to the reference potential terminal 60 via a series circuit comprising a second and a third transistor 103, 104. The second terminal of the second current mirror transistor 101 is likewise connected via a fourth transistor 105 to the reference potential terminal 60. The second terminal of the second current mirror transistor 101 is additionally connected to a first input 106 of the delay circuit 93. A second current mirror 107 comprises the third and fourth transistors 104, 105, as well as a fifth transistor 108. A first terminal of the third, of the fourth and of the fifth transistor 104, 105, 106 is connected to the reference potential terminal 60. A control terminal of the fifth transistor 108 is connected to a control terminal of the fourth transistor 105 and a control terminal of the third transistor 104, as well as to a second terminal of the fifth transistor 108. The fifth transistor 108 is coupled via a sixth transistor 109 to the voltage input 12. A control terminal of the sixth transistor 109 is connected to the input 97 of the evaluation circuit 92. The second terminal of the fifth transistor 108 is connected to a second input 110 of the delay circuit 93.

The delay circuit 93 has a seventh, eighth and ninth transistor 111, 112, 113. A control terminal of the seventh and of the eighth transistor 111,112 is connected to the first input 106 of the delay circuit 93. A control terminal of the ninth transistor 113 is connected to the second input 110 of the delay circuit 93. The seventh, the eighth and the ninth transistors 111, 112, 113 are connected to one another in series. A node 119 between the seventh and eighth transistors 111, 112 is connected via an additional input 114 of the evaluation circuit 92 to a control terminal of the second transistor 103. The second current mirror 107 likewise comprises the ninth transistor 113. The node 119 between the seventh and eighth transistors 111, 112 is connected via a capacitor 65 to the voltage input 12. The capacitor 65 is realized by means of a field effect transistor. The first and second current mirror transistors 99, 101, the power-down transistor 100, as well as the first, sixth and seventh transistors 102, 109, 111 are each realized as a p-channel field effect transistor. The second, third, fourth, fifth, eighth and ninth transistors 103, 104, 105, 108, 112, 113, are each implemented as an n-channel field effect transistor.

The node 119 between the seventh and eighth transistors 111, 112 is connected to one input 115 of the output driver 67. The output driver 67 comprises a third and a fourth inverter 116, 117. One input of the third inverter 116 is connected to the input 115 of the output driver 67. An output of the third inverter 116 is connected to an input of the fourth inverter 117 and an additional output 118 of the reset circuit 11. An output of the fourth inverter 117 is connected to the output 13 of the reset circuit 11.

A power-down signal PD is supplied via the input 69 of the reset circuit 11 to the deactivation circuit 91 and emitted, delayed by means of the first and of the second inverter 95, 96, as a derived power-down signal PDB to the input 97 of the evaluation circuit 92. An inverted power-down signal PDN can be tapped at the output of the first inverter 95 and thus at the additional input 120 of the evaluation circuit 92. The first transistor 102 and the first current mirror transistor 99 have the same conductivity type. The inverted power-down signal PDN is routed to the control terminal of the power-down transistor 100. If the derived power-down signal PDB has the logic value 1, then the first transistor 102 blocks, so that no current flows through the first and the second current mirror transistors 99,101. The inverted power-down signal PDN has the logic value 0, so that the power-down transistor 100 is conductive. Thus approximately the value of the input voltage VDD is present at the control terminal of the second current mirror transistor 101. With a logic value 1 for the delayed power-down signal PDB, the sixth transistor 109 is also turned off, so that the logic value 0 is present at the second input 110 of the delay circuit 93. If the inverted power-down signal PDN has the logic value 1, then the power-down transistor 100 is nonconductive. The derived power-down signal PDB has the logic value 0, so that the first transistor 102 is conductive. Consequently, the second current mirror transistor 101 emits a current for which a first part flows through the series connection of the second and the third transistors 103, 104 and a second part flows through the fourth transistor 105. If the delayed power-down signal PDB has the logic value 0, then a current flows through the sixth transistor 109 and thus through the fifth transistor 108. Since the fifth transistor 108, together with the third and fourth transistors 104, 105, form the second current mirror 107, a current likewise flows in this case through the third and the fourth transistors 104, 105. Corresponding to the current flows through the first and the second current mirrors 98, 107, a voltage VAR, which is routed to the seventh and eighth transistors 111, 112, appears at the first input 106 of the delay circuit 93. In case there is a current flow through the sixth and fifth transistors 109, 108, a voltage VDI at the second input 110 of the delay circuit 93 is sufficiently high that the ninth transistor 113 is switched on. If the voltage VAR is low, then the seventh transistor 111 is turned on and a voltage VCAP, which is present at the capacitor 65 and thus at the input 115 of the output driver 67, has approximately the value of the input voltage VDD.

The voltage VCAP is routed to the third inverter 116, so that an inverted reset signal POR_N with a low voltage value and thus the logic value 0 is emitted at the additional output 118 of the reset circuit 11.

The reset signal POR with the value of the input voltage VDD, and thus the logic value 1, is provided by means of the fourth inverter 117. The second transistor 103 is driven by the voltage VCAP in order to adjust a hysteresis of the evaluation circuit 92. If the voltage VAR has a sufficiently high value that the seventh transistor 111 is turned off and the eighth transistor 112 is turned on, then a charge flows out of the capacitor 65 via the eighth and ninth transistors 112, 113. Therefore the voltage VCAP falls, so that the inverted reset signal POR_N has a high voltage level and thus the logic value 1, and the reset signal POR has a low voltage level and thus the logic value 0. Thus the reset signal FOR transitions from the logic value 1 to the logic value 0 as a function of the threshold value VPH set by the evaluation circuit 92. The voltage VCAP is routed to the control terminal of the second transistor 103 in order that the reset signal POR and the inverted reset signal POR_N remain constant in case of a slight decrease in the input voltage VDD. If the reset signal POR is at the logic value 1 and the voltage VCAP is at a high level, then the second transistor 103 is turned on, so that the voltage VAR takes on a lower value than in case of a low value of the voltage VCAP and a value of logic 0 of the reset voltage POR.

The reset circuit 11 advantageously generates the reset signal POR automatically and without the supply of a reference current or reference voltage that would have to be provided by a source not comprised by the reset circuit. By means of a logic value 1 of the power-down signal PD, the reset signal POR can be advantageously brought to the logic value 1 independently of a level of the input voltage VDD.

In an alternative embodiment, not shown, the capacitor 65 is connected via the switch 66 to the voltage input 12. The switch 66 is realized as a transistor.

In an alternative embodiment, not shown, the capacitor 65 is realized as an integrated capacitor. The capacitor comprises two electrodes and a dielectric there between. The capacitor can be free of a monocrystalline substrate material of the semiconductor body 130.

FIGS. 3A-3G show exemplary signal curves in a circuit arrangement with a reset circuit according to the invention as a function of a time t. In detail, FIG. 3A shows the derived reset signal POR1, FIG. 3B the test adjustment signal TM and FIG. 3C the reset signal POR. The input voltage VDD, the supply voltage VBAT and the test voltage VTM are shown in FIGS. 3D and 3G. FIG. 3E shows the system reset signal SPOR and FIG. 3F the result signal TPOR. In a first phase A, between a point in time 0 and a first point in time t1, the supply voltage VBAT rises from a value of 0 V to a value of approximately 2.5 V The reset signal POR and the derived reset signal POR1 rise from 0 V to roughly 2.2 V in the first phase A. Since the test adjustment signal TM has the logic value 0, the circuit arrangement 10 is not in test operation, but in an operating state without a test. Thus the system reset signal SPOR likewise rises in the first phase A from 0 V to roughly 2.2 V, while the result signal TPOR has the value 0. In a second phase B, between the first point in time t1 and a second point in time t2, the supply voltage VBAT increases further up to a value of 4 V and then remains constant. Since the first threshold value VPH of the reset circuit 11 has therefore been exceeded, the reset signal POR and the derived reset signal POR1 take on the value 0 V. The system reset signal SPOR has likewise reached the value 0 V, while the result signal TPOR continues to indicate the value of 0 V. The supply voltage VBAT is constant in the further phases and remains at the value of 4 V. In the first and second phases A, B between the time point 0 and the second time point t2, the test voltage VTM has the value 0 V. At the end of the second phase B, the test voltage VTM is switched on and rises starting from a value of 3 V until it reaches the value 4 V in a third phase C, between the second point in time t2 and a third point in time t3. At the beginning of the third phase C, the test adjustment signal TM is set to the logic value 1.

In a fourth phase D between the third point in time t3 and a fourth point in time t4, the test voltage VTM decreases linearly, so that a second threshold value VPL of the reset circuit 11 is reached at a point in time tu. At the point in time tu, the reset voltage POR jumps from the value 0 V to a value of approximately 2 V, which corresponds to the value of the test voltage VTM, and thus the value of the input voltage VDD, at the point in time tu. The derived reset voltage POR1 takes on a value of approximately 4 V and the result signal TPOR likewise has the value of 4 V. In a fifth phase E, between the fourth point in time t4 and a fifth point in time t5, the test voltage VTM, and thus the input voltage VDD, increases linearly from a value of approximately 1.6 V to 3 V.

At a point in time to, the input voltage VDD exceeds the first threshold value VPH, so that the reset voltage POR, the derived reset voltage POR1 and the result signal TPOR are again lowered to 0 V. Between the point in time tu and the point in time to, the reset voltage POR follows the curve of the input voltage VDD. The derived reset voltage POR1 and the result signal TPOR, on the other hand, have a value of approximately 4 V in the time period between the point in time tu and the point in time to. From the beginning of a sixth phase F between the fifth point in time t5 and a sixth point in time t6, the test adjustment signal TM has the logic value 0 in place of the logic value 1. In the sixth period of time F, the supply voltage VBAT continues to be at the value 4 V. Therefore the reset signal POR, the derived reset signal POR1, the system reset signal SPOR and the result signal TPOR are at the value 0 V and have the logic value 0. The point in time tu and the point in time to are drawn more precisely in FIGS. 3E-3G. FIG. 3G shows a hysteresis H that lies between the second threshold value VPL and the first threshold value VPH. The value of the hysteresis H is approximately 0.2 V. The second threshold value VPL, which is effective for a decreasing input voltage VDD, has a value lower by the hysteresis H than the first threshold value VPH, which is effective for an increasing input voltage VDD.

Thus the two threshold values VPH, VPL of the reset circuit 11 can advantageously be tested. Since the effect of the capacitor 65 in the reset circuit 11 is cancelled by means of the test adjustment signal TM, the determination of the two threshold values VPH, VPL can be very fast since a time constant for the charging of the capacitor 65 need not be taken into account in case of a change in the test voltage VTM.

FIG. 4 shows an exemplary embodiment of a semiconductor body with the circuit arrangement according to the invention. The semiconductor body 130 comprises the circuit arrangement 10". The circuit arrangement 10" can be realized, for example, according to the embodiment shown in FIG. 1A or FIG. 1B. In FIG. 4, an improvement of the embodiment shown in FIG. 1A is shown for the sake of example. The circuit arrangement 10" is arranged on a first main surface 134 of the semiconductor body 130. The circuit arrangement 10" additionally comprises a control contact area 131. The control contact area 131 is connected to the second input 32 of the input logic circuit 28. The circuit arrangement 10" additionally comprises a clock contact area 132. The clock contact area 132 is connected to the third input 31 of the input logic circuit 28. The circuit arrangement 10" further comprises an additional contact area 133. The additional contact area 133 is connected to the circuit block 26.

The data signal SDAT can be tapped at the control contact area 131. The clock signal CLK can be tapped at the clock contact area 132. Signals that are generated in the circuit block 26 can be emitted via the additional contact area 133, or signals can be routed to the circuit block 26. The first and second contact areas 19, 20, the control contact area 131, the clock contact area 132, the output contact area 27 and the additional contact area 133 can be contacted from outside the semiconductor body 130. The aforementioned contact areas 19, 20, 27, 131, 132, 133 can be contacted by means of test pins for the duration of the test in a test operation. A wafer probe with a test card that comprises the test pins, and an electrical measuring device for emitting the signals and voltages and for receiving the signals and voltages can be used in this case.

The aforementioned contact areas can be contacted in a packaging process by means of bond wires or solder bumps, for example. In the packaging process, the aforementioned contact areas can be connected, for example, to a package or a circuit board.

In one embodiment, not shown, a first circuit is inserted between the control contact area 131 and the second input 32 of the input logic circuit 28.

In another embodiment, not shown, a second circuit can be inserted between the clock contact area 132 and the third input 31 of the input logic circuit 28.

The circuit arrangement 10" is produced on the semiconductor body 130 by means of a complementary metal oxide semiconductor integration technology, abbreviated CMOS technology. Alternatively, the circuit arrangement 10" can be produced by means of a bipolar integration technology. Alternatively, the circuit arrangement 10" can be produced by means of a bipolar-CMOS integration technology, abbreviated BiCMOS technology. The semiconductor body 130 can have silicon or silicon-germanium as the substrate material.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:
1. A circuit arrangement for testing a reset circuit, the circuit arrangement comprising:
 a reset circuit, comprising,
  a voltage input for feeding an input voltage, and an output for providing a reset signal as a function of the input voltage;

a changeover switch, comprising,
 a first input for feeding a test voltage,
 a second input for feeding a supply voltage,
 a control input for changing over between the first and the second input as a function of a test adjustment signal, and
 an output that is coupled to the voltage input of the reset circuit;

an output logic circuit, comprising,
 a first input, coupled to the output of the reset circuit,
 a second input for feeding the test adjustment signal,
 a first output for providing a system reset signal as a function of the reset signal and the test adjustment signal, and
 a second output for providing a result signal as a function of the reset signal and the test adjustment signal; and an input logic circuit, comprising,
 a first input, coupled to the first output of the output logic circuit,
 a second input for feeding a data signal, and
 an output for providing the test adjustment signal and coupled to the control input of the changeover switch and the second input of the output logic circuit.

2. The circuit arrangement according to claim 1, wherein the output logic circuit comprises:
 a third input, which is connected to the output of the changeover switch, and
 and a fourth input, which is coupled to the second input of the changeover switch.

3. The circuit arrangement according to claim 1, wherein the input logic circuit comprises a memory circuit comprising:
 a reset input connected to the first input of the input logic circuit,
 a data input connected to the second input of the input logic circuit, and
 a data output connected to the output of the input logic circuit.

4. The circuit arrangement according to claim 1, wherein, the reset circuit comprises:
 an output driver, connected on the output side to the output of the reset circuit, and
 a series circuit comprising,
  a capacitor for adjusting the time constant of the reset signal, and
  a switch to which the test adjustment signal can be routed at a control input, and
 wherein the series circuit of the capacitor and the switch is connected between an input of the output driver and the voltage input.

5. The circuit arrangement according to claim 1, comprising a buffer capacitor that couples the output of the changeover switch to a reference potential terminal.

6. The circuit arrangement according to claim 1, wherein a semiconductor substrate comprises the circuit arrangement.

7. A method for testing a reset circuit, comprising:
 feeding a supply voltage as an input voltage to the reset circuit in a normal operation;
 changing over from the normal operation to a test operation as a function of a test adjustment signal;
 feeding a test voltage as the input voltage to the reset circuit in the test operation;
 generating a reset signal by means of the reset circuit as a function of the input voltage; and
 emitting a system reset signal with a logic value that corresponds to the logic value of the reset signal in normal operation, and to a value deactivating a circuit block in the test operation.

8. The method according to claim 7, comprising emitting a result signal with a logic value that corresponds to the logic value of the reset signal in the test operation and to a constant logic value in the normal operation.

9. The method according to claim 7, comprising providing the test adjustment signal as a function of a data signal and the system reset signal.

10. The method according to claim 7, comprising;
 feeding the test voltage to a first input of a changeover switch;
 feeding the supply voltage to a second input of the changeover switch;
 routing the test adjustment signal to a control input of the changeover switch; and
 changing over an output of the changeover switch between the first and the second input of the changeover switch as a function of the test adjustment signal.

11. The method according to claim 10, wherein a semiconductor substrate comprises a circuit arrangement that comprises the reset circuit and the changeover switch.

* * * * *